United States Patent [19]

Shirai

[11] Patent Number: 5,179,431

[45] Date of Patent: Jan. 12, 1993

[54] SEMICONDUCTOR PHOTODETECTION DEVICE

[75] Inventor: Tatsunori Shirai, Yokohama, Japan

[73] Assignee: Fujitsu Limited, Kawasaki, Japan

[21] Appl. No.: 813,051

[22] Filed: Dec. 23, 1991

Related U.S. Application Data

[63] Continuation of Ser. No. 615,754, Nov. 19, 1990, abandoned.

[30] Foreign Application Priority Data

Nov. 20, 1989 [JP] Japan .................................. 1-301064

[51] Int. Cl.$^5$ ..................... H01L 29/205; H01L 31/10
[52] U.S. Cl. .................................................... 257/187
[58] Field of Search ............................. 357/30, 13, 16

[56] References Cited

U.S. PATENT DOCUMENTS 4,651,187  3/1987  Sugimoto et al. ..................... 357/30

FOREIGN PATENT DOCUMENTS

| 0001139 | 3/1979 | European Pat. Off. . |
| 0108561 | 5/1984 | European Pat. Off. . |
| 0304048 | 2/1989 | European Pat. Off. . |
| 63-281479 | 11/1988 | Japan ..................... 357/30 |
| 3-34473 | 2/1991 | Japan . |

OTHER PUBLICATIONS

Patent Abstracts of Japan, vol. 11, No. 108 (E-495) (2555) Apr. 4, 1987, & JP-A-61 256771 (Fujitsu Limited) Nov. 14, 1986.
Patent Abstracts of Japan, vol. 11, No. 119 (E-499) (2566) Apr. 14, 1987, & JP-A-61 267376 (NEC Corporation) Nov. 26, 1986.

Primary Examiner—Jerome Jackson, Jr.
Attorney, Agent, or Firm—Armstrong & Kubovcik

[57] ABSTRACT

An avalanche photodiode comprises a substrate, a first semiconductor layer provided on the substrate and made of a first group III-V compound semiconductor material doped to a first conductivity type for producing carriers in response to optical radiation incident to the avalanche photodiode, a second semiconductor layer provided on the first semiconductor layer and comprising a second group III-V compound semiconductor material doped to the first conductivity for causing an avalanche multiplication of the carriers, a photoreception region formed within the second semiconductor layer and doped to a second conductivity type for forming a p-n junction at an interface to the second semiconductor layer, and a guard ring formed along a lateral boundary of the photoreception region. The second semiconductor layer comprises a first layer, a second layer and a third layer with respective impurity concentration levels such that the impurity concentration level of the first layer is substantially smaller than the impurity concentration level of the second layer and the impurity concentration level of the third layer is substantially smaller than the impurity concentration level of the second layer. The guard ring region is formed such that the guard ring region extends at least into the second layer.

7 Claims, 6 Drawing Sheets

SEMICONDUCTOR PHOTODETECTION DEVICE

This application is a continuation of application Ser. No. 615,754 filed Nov. 19, 1990, now abandoned.

BACKGROUND OF THE INVENTION

The present invention generally relates to semiconductor devices and more particularly to a semiconductor photodetection device using a compound semiconductor material.

Semiconductor photodetection devices are used in various technical fields such as optical telecommunication. Particularly, the devices that are formed on the compound semiconductor materials such as InP, InGaAs, and the like, play a major role in the advanced optical telecommunication system. Among various semiconductor photodetection devices, the avalanche photodiode (APD) using InGaAs is particularly important for the long distance optical telecommunication trunks because of the excellent sensitivity.

In the avalanche photodiodes, a member called a guard ring is used in correspondence to a surface electrode for sustaining a large bias voltage applied to the surface electrode for causing the avalanche multiplication of the carriers.

FIG. 1 shows a conventional avalanche photodiode.

Referring to FIG. 1, the avalanche photodiode is constructed on a n+-type InP substrate 1. More specifically, there is formed an optical absorption layer 2 of n-type InGaAs on the substrate 1, and an intermediate layer 3 of n-type InGaAsP is provided on the optical absorption layer 2. Further, a n-type InP avalanche multiplication layer 4 is provided on the intermediate layer 3, and a n⁻-type InP layer 5 having an impurity concentration level different from that of the layer 4 is provided on the avalanche multiplication layer 4. In a part of the InP layer 5, there is provided a p+-type InP region 6 forming a window for receiving optical radiation. Thereby, there is formed a p-n junction at an interface between the InP region 6 and the rest of the InP layer 5.

Around the InP region 6, there is formed a guard ring 7 for ensuring that the avalanche photomultiplication occurs at the p-n junction formed between the region 6 and the layer 5, and the entire structure is protected by a silicon nitride passivation film 8 that covers the upper surface of the InP layer 5. Further, in correspondence to the guard ring 7, there is provided an electrode 9 on the passivation film 8 in electrical contact with the guard ring 7. Furthermore, an opposing electrode 10 is provided at a bottom surface of the substrate 1.

In operation, a large bias voltage is applied across the electrode 9 and the electrode 10 such that the p-n junction at interface between the p+-type region 6 and the n⁻-type InP layer 5 is reverse biased. Upon incidence of optical radiation through the region 6, the photons of the optical radiation are absorbed by the optical absorption layer 2 and thereby the electrons and holes are formed in the layer 2. The holes then migrate into the region 6 and collected by the electrode 9, while the electrons are collected by the electrode 10 after passing through the substrate 1. As there is established a large electric field in the p-n junction between the region 6 and the layer 5, the holes that entered into the p+-region 6 are accelerated and thereby the multiplication of the electrons and holes occurs by the avalanche effect.

It should be noted that the guard ring 7 is provided such that the concentration of the electric field at the outer edge of the p+-region 6 is avoided and the avalanche multiplication occurs always at the p-n junction formed at the central part of the region 6. In the illustrated example, the impurity concentration level of the n⁻-type InP layer 5 is decreased such that the lateral spreading of the depletion region formed at the p-n junction is facilitated. Thereby, the concentration of the electric field due to the curvature of the guard ring 7 is relaxed and a sufficient breakdown voltage, larger than that of the region 6, is obtained for the guard ring 7 with respect to the n⁻-type InP layer 5.

FIG. 2 shows another conventional example. In this structure, there is provided a second, shallow guard ring 11 at the outside of the guard ring 7 for further relaxation of the electric field concentration.

In any of the foregoing examples, it is necessary to increase the impurity concentration level of the n-type avalanche multiplication layer 4 in order to achieve an improved response of the avalanche photodiode. Such a requirement of the improved response is particularly acute in the devices that are used in the optical telecommunications field. However, the increase in the impurity concentration level of the layer 4 invites a decrease in the breakdown voltage between the guard ring 7 and the n⁻-type InP region 5. For example, when the layer 4 is doped to the impurity concentration level of $5 \times 10^{16} cm^{-3}$, the breakdown voltage of the guard ring 7 is decreased to about 50–60 volts. This breakdown voltage is substantially equal to or smaller than the breakdown voltage of about 60 volts of the p+-type region 6, and thus, the avalanche photodiode does not operate properly.

SUMMARY OF THE INVENTION

Accordingly, it is a general object of the present invention to provide a novel and useful avalanche photodiode wherein the foregoing problems are eliminated.

Another and more specific object of the present invention is to provide an avalanche photodiode having an improved response.

Another object of the present invention is to provide an avalanche photodiode wherein a sufficient breakdown voltage is secured for the guard ring even when the impurity concentration level is increased in the n-type InP avalanche multiplication layer.

Another object of the present invention is to provide an avalanche photodiode comprising a semiconductor substrate of a first conductivity type, a first compound semiconductor layer of the first conductivity type provided on the semiconductor substrate for absorbing optical radiation incident to the avalanche photodiode and having a first band gap, a second compound semiconductor layer of the first conductivity type provided on the first compound semiconductor layer and having a second band gap that is larger than the first band gap, a photoreception region of a second conductivity type opposite from the first conductivity type formed in the second compound semiconductor layer, and a guard ring region of the second conductivity type formed to surround the photoreception region along a boundary thereof, said second compound semiconductor layer comprising a first layer having a first impurity concentration level, a second layer having a second concentration level that is larger than the first impurity concentration level and provided on the first layer for inducing avalanche multiplication of carriers, and a third layer having a third impurity concentration level that is smaller than the second impurity concentration level and provided on the second layer, wherein the guard ring is formed such that the guard ring extends into the second layer passing through the third layer. According to the present invention, a sufficient breakdown voltage exceeding 100 volts is achieved for the guard ring. This is due to the finding of the applicant that forms the basis of the present invention that the breakdown voltage of the guard ring increases with decreasing distance between the deepest level of the guard ring and the top surface of the first layer. The guard ring may even contact or penetrate through the top surface of the first layer. Thereby, one can increase the impurity concentration level of the first layer acting as the avalanche multiplication layer without degrading the breakdown voltage of the guard ring and the response of the avalanche photodiode is improved.

Other objects and further features of the present invention will become apparent from the following detailed description when read in conjunction with the attached drawings.

DETAILED DESCRIPTION OF THE PREFERRED EMBODIMENTS

Figure 1:
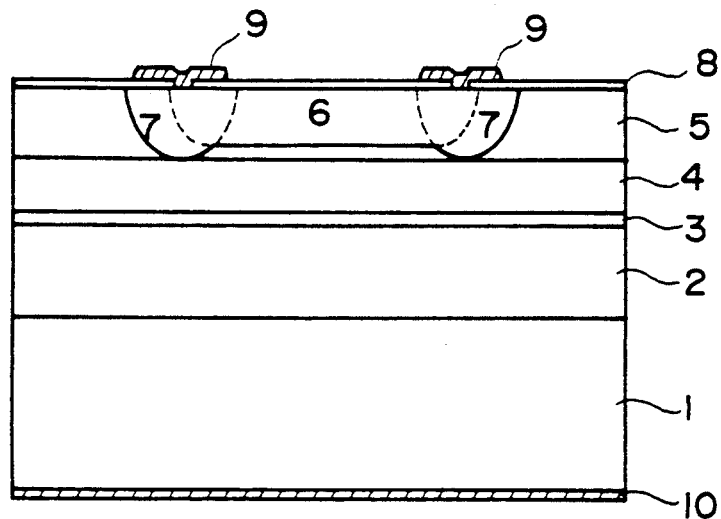
FIG. 1 is a diagram showing the structure of a conventional avalanche photodiode.
Figure 2:
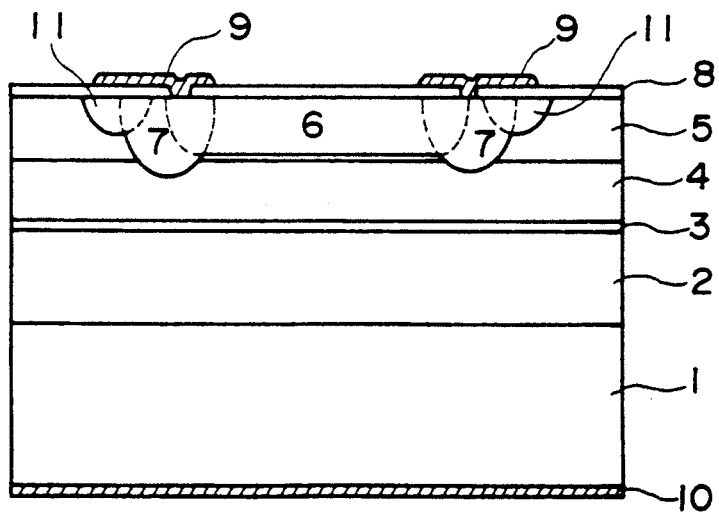
FIG. 2 is a diagram showing the structure of another conventional avalanche photodiode.
Figure 3:
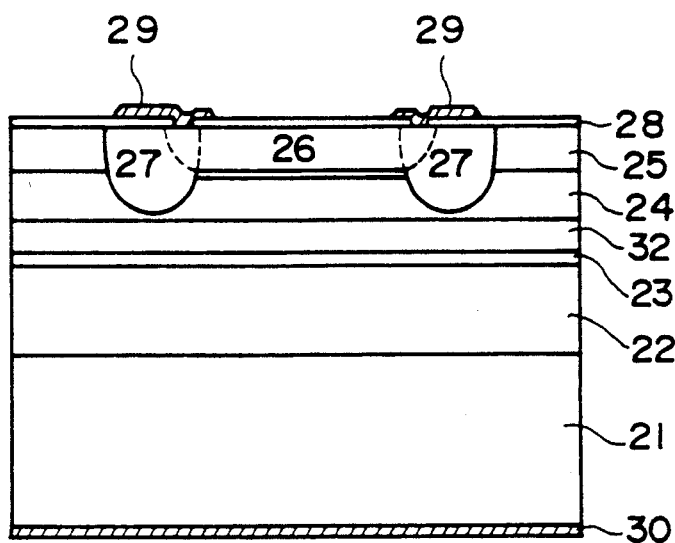
FIG. 3 is a diagram showing the structure of an avalanche photodiode according to an example of the present invention.

FIG. 3 shows a first embodiment of the avalanche photodiode of the present invention.

Referring to FIG. 3, the avalanche photodiode is constructed on a n+-type InP substrate 21, and there is provided an optical absorption layer 22 of n-type InGaAs having the impurity concentration level of $5 \times 10^{15} cm^{-3}$, on the substrate 21 with a thickness of 2 $\mu$m. Further, an intermediate layer 23 of n-type InGaAsP is formed on the optical absorption layer 22 with a thickness of 0.3 $\mu$m. The layer 23 is doped to an impurity concentration level of $5 \times 10^{15} cm^{-3}$.

On the intermediate layer 23, there is formed a n⁻-type InP layer 32 doped to the impurity concentration level of $5 \times 10^{15} cm^{-3}$ with a thickness of 0.5 $\mu$m, and another InP layer 24 doped to the n-type with the impurity concentration level of $5 \times 10^{16} cm^{-3}$ is formed with a thickness of 0.5 $\mu$m. As will be described later, this layer 24 acts as the avalanche multiplication layer causing the avalanche multiplication of the carriers. Further, another n⁻-type InP layer 25 doped to the impurity concentration level of $5 \times 10^{15} cm^{-3}$ is formed on the n-type InP layer 24 with a thickness of 1 $\mu$m.

In the central part of the layer 25, there is formed a p+-type region 26, by the diffusion of Cd for example, to an impurity concentration level of $10^{18} cm^{-3}$. The region 26 may be formed with a diameter of about 100 $\mu$m and such that the region 26 extends toward the layer 24 up to the vicinity of the boundary between the layer 24 and the layer 25.

The p+-type region 26 is defined laterally by a boundary, and there is formed a guard ring region 27, doped to the p+-type by the ion implantation of Be with the impurity concentration level of $1 \times 10^{16} cm^{-3} - 1 \times 10^{17} cm^{-3}$ such that the guard ring region 27 reaches a depth close to the boundary between the layer 24 and the underlying n-type InP layer 32. In other words, the guard ring region 27 penetrates through the layer 25 and extends into the layer 24. This guard ring region 27 may reach or exceed the boundary between the layer 24 and the layer 32 as will be described later. It should be noted that the guard ring region 27 has a top surface that coincides with the top surface of the InP layer 25.

On the top surface of the InP layer 25, there is provided a passivation film 28 of silicon nitride for protecting the surface, and there the passivation film 28 is patterned to expose the top surface of the guard ring region 27. On the exposed part of the guard ring region 27, there is provided an electrode 29 of gold-zinc (Au-Zn) layered structure by deposition and patterning. Further, an electrode 30 of gold-germanium (Au-Ge) layered structure is provided on the entire bottom surface of the substrate 21 as an electrode that opposes the electrode 29.

In operation, a reverse bias voltage is applied across the electrode 29 and the electrode 30 such that a depletion region is formed in correspondence to the p-n junction between the p+-type region 26 and the n⁻-type layer 25. As usual, the guard ring region 27 eliminates the concentration of the electric field at the boundary or edge of the p+-type region 26 and ensures a uniform electric field throughout region 26.

Upon incidence of an optical beam that has a wavelength that interacts with InGaAs forming the optical absorption layer 22, a number of electron-hole pairs are formed upon the absorption of the photons. Thereby, the holes are attracted to the electrode 29 applying a negative voltage while the electrons are attracted to the electrode 30 applying a positive voltage. The holes are then accelerated in the avalanche multiplication layer 24 and thereby a number of electron-hole pairs are created in the layer 24 as a result of the avalanche effect. Because of this multiplication of the carriers, the avalanche photodiode provides an advantageous feature of increased sensitivity and reduced noise.

Figure 4:
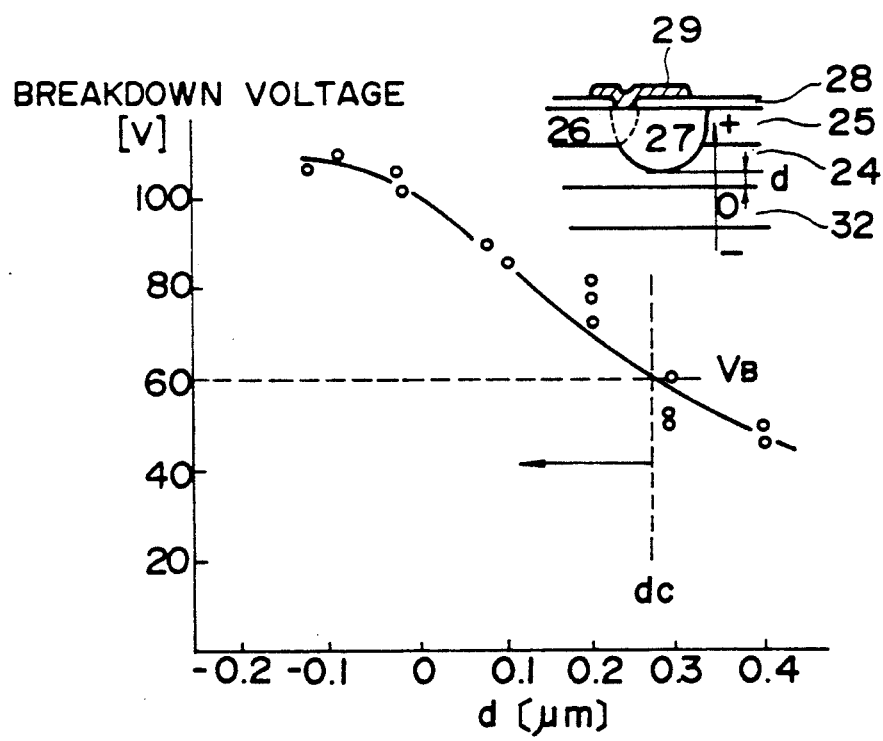
FIG. 4 is a graph showing a relationship between the breakdown voltage of the guard ring and the vertical extension of the guard ring used in the device of FIG. 3.

FIG. 4 shows the relationship between the breakdown voltage of the guard ring 27 and the depth of the guard ring 27 measured from the boundary between the layer 32 and the layer 24. This relationship was obtained by preparing a number of samples that have the structure shown in FIG. 3 while changing the distance d specified in FIG. 3 and by measuring the breakdown voltage of the guard ring region 27.

As can be seen clearly from FIG. 4, the breakdown voltage of the guard ring region 27 increases with decreasing distance d, and reaches a maximum somewhere between d=0 and d=−0.1. In the case of d =0, the tip of the region 27 reaches the boundary between the layer 24 and the layer 32, while if the parameter d having a negative value, the region 27 extends beyond the boundary into the layer 32. In any case, a breakdown voltage exceeding 70 volts, that is higher than the breakdown voltage of about 60 volts for the p-type region 26, is obtained when the distance d is set to about 0.2 μm or smaller. Generally, the parameter d is set smaller than a value $d_c$ shown in FIG. 4 wherein the breakdown voltage of the guard ring 27 is coincident to the breakdown volta $V_B$ of the region 26.

When the breakdown voltage of the impurity concentration level of the guard ring region 27 is increased as such, the impurity concentration level of the avalanche multiplication layer 24 can be increased and the response of the device is improved. It should be noted that the impurity concentration level of the layer 24 has conventionally been limited to $2-3\times10^{16} cm^{-3}$ because of the breakdown of the guard ring 27.

Next, another feature of the present invention with respect to the n-type layer 32 that is used in combination of the guard ring region 27 will be described.

The lightly doped n⁻-type InP layer 32 is interposed between the layer 24 and the intermediate layer 33 for reducing the electric field applied to the part of the layer 24 adjacent to the intermediate layer 23. It should be noted that the heavily doped guard ring region 27 extending deeply into the layer 24 and reaching the vicinity of the interface between the layer 24 and the layer 32 induces an increase in the electric field for those parts of the InGaAs optical absorption layer 22 adjacent to the intermediate layer 33.

Figure 5:
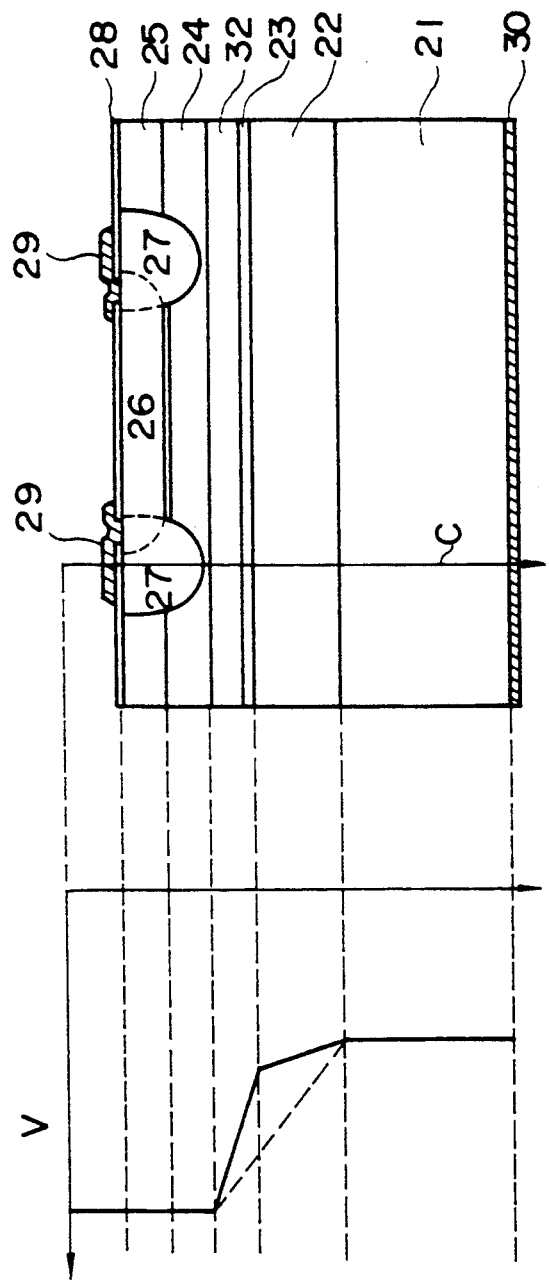
FIG. 5 is a diagram showing the discribution of electric potential in the structure of FIG. 3.

FIG. 5 shows, by a broken line, the distribution of the electric potential V in the device when the InP layer 32 is not provided. The profile is taken along a path C passing through the electrode 29 as shown therein. In this case, there appears a steep slope in the distribution showing a large electric field appearing in the region between the guard ring 27 and the substrate 21, including the optical absorption layer 22.

Figure 6:
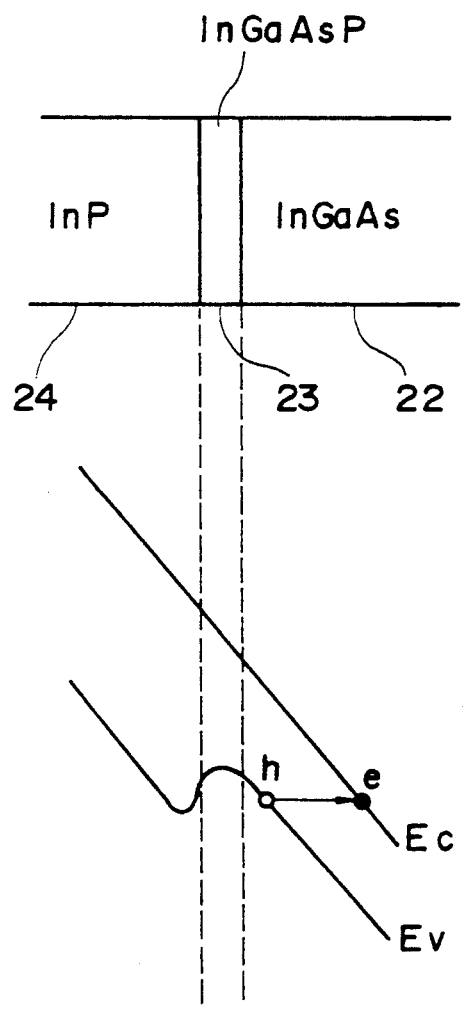
FIG. 6 is a diagram showing the band structure of the optical absorption layer employed in the structure of FIG. 3.

When such a large electric field is applied to the optical absorption layer, there is a chance that tunnel electrons flow within the region 22 by causing a transition from the valence band Ev to the conduction band Ec as shown in FIG. 6. Such a tunnel current flows irrespective of whether there is an incidence of the optical beam to the device or not and forms the dark current or noise. In the present invention, the large electric field in the optical absorption layer 22 is relaxed by interposing the less conductive InP layer 32 between the layer 23 and the layer 24 as illustrated by the solid line in FIG. 5. Such a large electric field applied to the InP layer 32 does not cause the transition of the tunnel electrons as InP has a band gap of 1.34 eV that is substantially larger than the band gap of 0.75 eV of InGaAs. Of course, when the profile of FIG. 5 is taken along a path passing through the center of the region 26, there appears a slope in the distribution of the electric potential in the layer 24 indicating that there is an electric field that causes the avalanche multiplication of the carriers.

Next, the process of producing the structure of FIG. 3 will be described with reference to FIGS. 7A-7D.

Figure 7A:
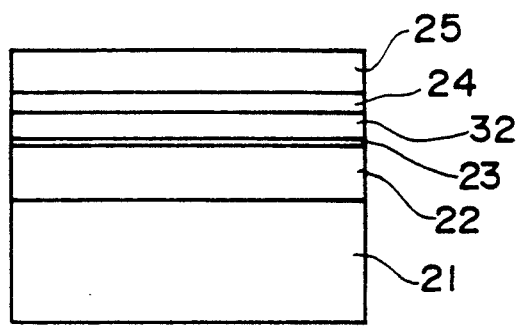
FIGS. 7A-7D are diagrams showing the process of forming the avalanche photodiode of FIG. 3.

In a first step of FIG. 7A, the InGaAs optical absorption layer 22 is grown epitaxially on the InP substrate 21 with the thickness of 2 μm. As already described, the InP substrate 21 is doped to the n⁺-type and the layer 22 is doped to the n-type with the impurity concentration level of $5\times10^{15} cm^{-3}$. Further, the n-type In-GaAsP intermediate layer 23 is grown on the layer 22 with the thickness of 0.3 μm and the impurity concentration level of $5\times10^{15} cm^{-3}$. Further, the n⁻-type InP layer 32, the n-type InP layer 24 and the n-type InP layer 25 are grown successively grown on the layer 23 respectively with the thickness of 0.5 μm, 0.5 μm and 1 μm. As already described, the impurity concentration levels of the layers 32, 24 and 25 are $5\times10^{15} cm^{-3}$, $5\times10^{16} cm^{-3}$ and $5\times10^{15} cm^{-3}$, respectively. Thereby, the structure shown in FIG. 7A is obtained.

Figure 7B:
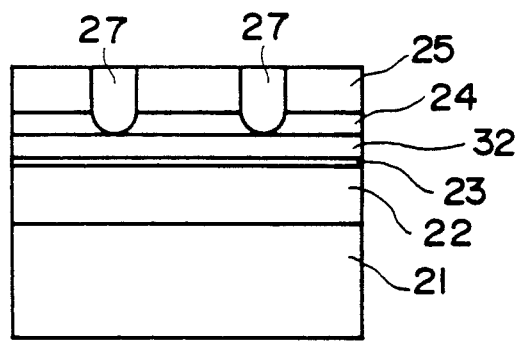

Next, the structure of FIG. 7A is subjected to an ion implantation process of Be carried out under an acceleration voltage of 150 eV and a dose of $5\times10^{13} cm^{-2}$. After the ion implantation, the structure is subjected to an annealing process at 750° C. for 30 minutes. With this process, the implanted Be atoms are driven in and the guard ring region 27 is formed with the thickness of about 1.5 μm. Thereby, the lower end of the region 27 reaches the boundary between the layer 32 and the layer 24 as shown in FIG. 7B.

Next, a silicon nitride film not illustrated is deposited on the surface of the structure of FIG. 7B by a plasma chemical vapor deposition process and is patterned subsequently to expose an area of the surface of the layer 25 in correspondence to the region 26. Further, using the patterned silicon nitride film as the mask, Cd is diffused into the layer 25 by a thermal drive-in process undertaken at 550° C. for 20 minutes. Thereby the p⁺-type region 26 is formed with the thickness of about 1 μm as shown in FIG. 7C.

Figure 7C:
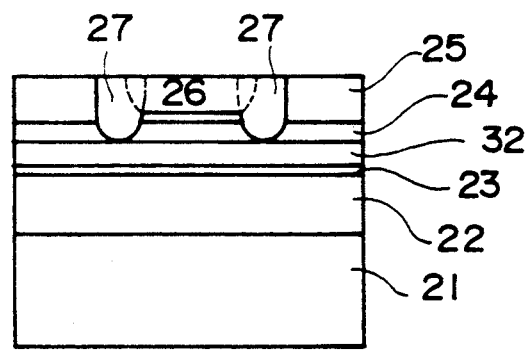
Figure 7D:
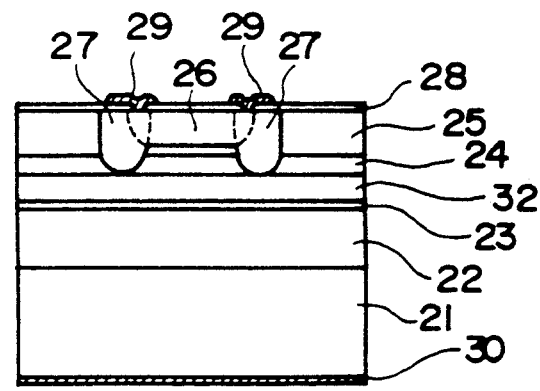

After the step of FIG. 7C, the patterned silicon nitride film is removed by etching and the passivation film 28 of silicon nitride is deposited on the surface of the layer 25 by the plasma chemical vapor deposition process. The passivation film 28 is then patterned to expose the region of the layer 25 wherein the guard ring region 27 is formed, and in correspondence to the exposed guard ring region 27, the electrode 29 is deposited. Next, the electrode 30 is deposited on the bottom surface of the substrate 21 and the structure of FIG. 3 is completed as shown in FIG. 7D.

Figure 8:
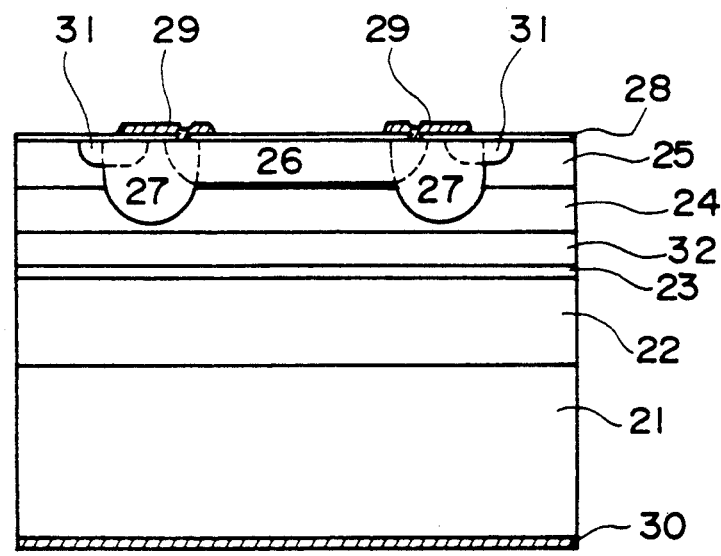
FIG. 8 is a diagram showing the structure of the avalanche photodiode according to a second embodiment of the present invention.

FIG. 8 shows a second embodiment of the avalanche photodiode of the present invention. In this embodiment, there is provided a second guard ring 31 at the outer boundary of the guard ring region 27. Thereby, the concentration of the electric field at the guard ring 31 is further relaxed. Other parts of this embodiment are identical with those already described and the description thereof will be omitted.

Further, it should be noted that the present invention is applicable also for the case wherein the conductivity type of each semiconductor layers in the structure is reversed.

Further, the present invention is not limited to these embodiments described heretofore, but various variations and modifications may be made without departing from the scope of the invention.

What is claimed is:

1. An avalanche photodiode for detecting optical radiation, comprising:
    a substrate of a semiconductor material and having an upper major surface and a lower major surface;
    a first semiconductor layer having an upper major surface and a lower major surface and provided on the upper major surface of the substrate, said first semiconductor layer comprising a first group III-V compound semiconductor material doped to a first conductivity type and having a band gap corresponding to a wavelength of the optical radiation to be detected, said first semiconductor layer producing carriers in response to the optical radiation incident to the avalanche photodiode;

a second semiconductor layer having an upper major surface and a lower major surface and provided on the upper major surface of the first semiconductor layer, said second semiconductor layer comprising a second group III-V compound semiconductor material doped to the first conductivity type and having a band gap substantially larger than the band gap of the first semiconductor layer, said second semiconductor layer being supplied with the carriers produced in the first semiconductor layer for causing an avalanche multiplication of the carriers;

a photoreception region having an upper major surface a lower major surface and a lateral boundary and formed within the second semiconductor layer such that the upper major surface of the photoreception region coincides substantially with the upper major surface of the second semiconductor layer and such that the lower major surface of the photoreception region is located above the lower major surface of the second semiconductor layer, said lateral boundary connecting the upper major surface and the lower major surface of the photoreception region and extending to surround the photoreception region, said photoreception region comprising the second group III-V compound semiconductor material and doped to a second, opposite conductivity type and permitting passage of an optical beam incident to the avalanche photodiode, said lower boundary of the photoreception region forming a p-n junction between the photoreception region and the second semiconductor layer located underneath, said photoreception region having a first breakdown voltage;

a guard ring region having an upper major surface and formed in the second semiconductor layer along the lateral boundary of the photoreception region and in continuation therewith such that the upper major surface of the guard ring region is adjacent to the upper major surface of the second semiconductor layer, said guard ring region comprising the second group III-V compound semiconductor material that is doped to the second conductivity type and surrounded by a boundary that has a protrusion toward the lower major surface of the second semiconductor layer, said guard ring region having a second breakdown voltage;

a first electrode provided on the upper major surface of the guard ring region for making an electrical contact therewith; and a second electrode provided on the lower major surface of the substrate for making an electrical contact therewith;

said first and second electrodes being adapted to be applied with a first polarity bias voltage and a second, opposite polarity bias voltage respectively, for applying a reverse bias voltage to the p-n junction formed at the lower major surface of the photoreception region and further for collecting the carriers that are formed in response to the optical radiation and the avalanche multiplication;

said second semiconductor layer comprising a first material layer of the second group III-V compound semiconductor material having an upper major surface and a lower major surface adjacent to the lower major surface of the second semiconductor layer, a second material layer of the second group III-V compound semiconductor material having an upper major surface and a lower major surface and provided on the upper major surface of the first material layer, and a third material layer of the second group III-V compound semiconductor material and provided on the upper major surface of the second material layer such that the upper major surface of the third material layer is adjacent to the upper major surface of the second semiconductor layer, said first, second and third material layers having respective impurity concentration levels such that the impurity concentration level of the first material layer is substantially smaller than the impurity concentration level of the second material layer and the impurity concentration level of the third material layer is substantially smaller than the impurity concentration level of the second material layer;

said photoreception region being formed such that the lower major surface of the photoreception region is adjacent to the lower major surface of the third material layer;

the guard ring region being formed such that said protrusion has a lower edge extending to the vicinity of a boundary between the first material layer and the second material layer with a distance from the upper major surface of the first material layer set such that the second breakdown voltage becomes larger than the first breakdown voltage.

2. An avalanche photodiode as claimed in claim 1 in which said first group III-V compound semiconductor material comprises InGaAs and said second group III-V compound semiconductor material comprises InP.

3. An avalanche photodiode as claimed in claim 1 in which said second material layer of the second semiconductor layer has the impurity concentration level of about $3 \times 10^{16} \mathrm{cm}^{-3}$ or more.

4. An avalanche photodiode as claimed in claim 1 in which said first layer of the second material semiconductor layer has the impurity concentration level of about $5 \times 10^{15} \mathrm{cm}^{-3}$ or less.

5. An avalanche photodiode for detecting optical radiation, comprising:

a substrate of a semiconductor material and having an upper major surface and a lower major surface;

a first semiconductor layer having an upper major surface and a lower major surface and provided on the upper major surface of the substrate, said first semiconductor layer comprising a first group III-V compound semiconductor material doped to a first conductivity type and having a band gap corresponding to a wavelength of the optical radiation to be detected, said first semiconductor layer producing carriers in response to the optical radiation incident to the avalanche photodiode;

a second semiconductor layer having an upper major surface and a lower major surface and provided on the upper major surface of the first semiconductor layer, said second semiconductor layer comprising a second group III-V compound semiconductor material doped to the first conductivity type and having a band gap substantially larger than the band gap of the first semiconductor layer, said second semiconductor layer being supplied with the carriers produced in the first semiconductor layer for causing an avalanche multiplication of the carriers;

a photoreception region having an upper major surface a lower major surface and a lateral boundary and formed within the second semiconductor layer such that the upper major surface of the photoreception region coincides substantially with the upper major surface of the second semiconductor layer and such that the lower major surface of the photoreception region is located above the lower major surface of the second semiconductor layer, said lateral boundary connecting the upper major surface and the lower major surface of the photoreception region and extending to surround the photoreception region, said photoreception region comprising the second group III-V compound semiconductor material and doped to a second, opposite conductivity type and permitting passage of an optical base incident to the avalanche photodiode, said lower boundary of the photoreception region forming a p-n junction between the photoreception region and the second semiconductor layer located underneath, said photoreception region having a first breakdown voltage;

a guard ring region having an upper major surface and formed in the second semiconductor layer along the lateral boundary of the photoreception region and in continuation therewith such that the upper major surface of the guard ring region is adjacent to the upper major surface of the second semiconductor layer, said guard ring region comprising the second group III-V compound semiconductor material that is doped to the second conductivity type and surrounded by a boundary that has a protrusion, said guard ring region having a second breakdown voltage;

a first electrode provided on the upper major surface of the guard ring region for making an electrical contact therewith; and a second electrode provided on the lower major surface of the substrate for making an electrical contact therewith;

said first and second electrodes being adapted to be applied with a first polarity bias voltage and a second, opposite polarity bias voltage respectively, for applying a reverse bias voltage to the p-n junction formed at the lower major surface of the photoreception region and further for collecting the carriers that are formed in response to the optical radiation and the avalanche multiplication;

said second semiconductor layer comprising a first material layer of the second group III-V compound semiconductor material having an upper major surface and a lower major surface adjacent to the lower major surface of the second semiconductor layer, a second material layer of the second group III-V compound semiconductor material having an upper major surface and a lower major surface and provided on the upper major surface of the first material layer, and a third material layer of the second group III-V compound semiconductor material and provided on the upper major surface of the second material layer such that the upper major surface of the third material layer is adjacent to the upper major surface of the second semiconductor layer, said first, second and third material layers having respective impurity concentration levels such that the impurity concentration level of the first material layer is substantially smaller than the impurity concentration level of the second material layer and the impurity concentration level of the third material layer is substantially smaller than the impurity concentration level of the second material layer;

said photoreception region being formed such that the lower major surface of the photoreception region is adjacent to the lower major surface of the third material layer;

the guard ring region being formed such that said protrusion of the guard ring region has a lower edge which reaches the lower major surface of the second material layer with a distance form the upper major surface of the first material layer set such that the second breakdown voltage becomes larger than the first breakdown voltage.

6. An avalanche photodiode as claimed in claim 1 in which said lower edge of said protrusion is separated from the upper major surface of the first material layer by about 0.2 $\mu$m or less.

7. An avalanche photodiode for detecting optical radiation, comprising:

a substrate of a semiconductor material and having an upper major surface and a lower major surface;

a first semiconductor layer having an upper major surface and a lower major surface and provided on the upper major surface of the substrate, said first semiconductor layer comprising a first group III-V compound semiconductor material doped to a first conductivity type and having a band gap corresponding to a wavelength of the optical radiation to be detected, said first semiconductor layer producing carriers in response to the optical radiation incident to the avalanche photodiode;

a second semiconductor layer having an upper major surface and a lower major surface and provided on the upper major surface of the first semiconductor layer, said second semiconductor layer comprising a second group III-V compound semiconductor material doped to the first conductivity type and having a band gap substantially larger than the band gap of the first semiconductor layer, said second semiconductor layer being supplied with the carriers produced in the first semiconductor layer for causing an avalanche multiplication of the carriers;

a photoreception region having an upper major surface a lower major surface and a lateral boundary and formed within the second semiconductor layer such that the upper major surface of the photoreception region coincides substantially with the upper major surface of the second semiconductor layer and such that the lower major surface of the photoreception region is located above the lower major surface of the second semiconductor layer, said lateral boundary connecting the upper major surface and the lower major surface of the photoreception region and extending to surround the photoreception region, said photoreception region comprising the second group III-V compound semiconductor material and doped to a second, opposite conductivity type and permitting passage of an optical beam incident to the avalanche photodiode, said lower boundary of the photoreception region forming a p-n junction between the photoreception region and the second semiconductor layer located underneath, said photoreception region having a first breakdown voltage;

a guard ring region having an upper major surface and formed in the second semiconductor layer along the lateral boundary of the photoreception region and in continuation therewith such that the upper major surface of the guard ring region is adjacent to the upper major surface of the second semiconductor layer, said guard ring region comprising the second group III-V compound semiconductor material that is doped to the second conductivity type and surrounded by a boundary that has a protrusion, said guard ring region having a second breakdown voltage;

a first electrode provided on the upper major surface of the guard ring region for making an electrical contact therewith; and a second electrode provided on the lower major surface of the substrate for making an electrical contact therewith;

said first and second electrodes being adapted to be applied with a first polarity bias voltage and a second, opposite polarity bias voltage respectively, for applying a reverse bias voltage to the p-n junction formed at the lower major surface of the photoreception region and further for collecting the carriers that are formed in response to the optical radiation and the avalanche multiplication;

said second semiconductor layer comprising a first material layer of the second group III-V compound semiconductor material having an upper major surface and a lower major surface adjacent to the lower major surface of the second semiconductor layer, a second material layer of the second group III-V compound semiconductor material having an upper major surface and a lower major surface and provided on the upper major surface of the first material layer, and a third material layer of the second group III-V compound semiconductor material and provided on the upper major surface of the second material layer such that the upper major surface of the third material layer is adjacent to the upper major surface of the second semiconductor layer, said first, second and third material layers having respective impurity concentration levels such that the impurity concentration level of the first material layer is substantially smaller than the impurity concentration level of the second material layer and the impurity concentration level of the third material layer is substantially smaller than the impurity concentration level of the second material layer;

said photoreception region being formed such that the lower major surface of the photoreception region is adjacent to the lower major surface of the third material layer;

the guard ring region being formed such that said protrusion of the guard ring region has a lower edge which reaches below said boundary between the first material layer and the second material layer with a distance from the upper major surface of the first material layer set such that the second breakdown voltage becomes larger than the first breakdown voltage.

* * * * *